United States Patent
Suda et al.

(10) Patent No.: US 7,570,924 B2
(45) Date of Patent: Aug. 4, 2009

(54) HIGH FREQUENCY SIGNAL RECEIVING DEVICE

(75) Inventors: Toru Suda, Kanagawa (JP); Kazuhiko Maejima, Kanagawa (JP); Yasuhiro Shimizu, Kanagawa (JP)

(73) Assignee: Sony Corporation (JP)

( * ) Notice: Subject to any disclaimer, the term of this patent is extended or adjusted under 35 U.S.C. 154(b) by 618 days.

(21) Appl. No.: 11/321,985

(22) Filed: Dec. 29, 2005

(65) Prior Publication Data
US 2006/0170827 A1 Aug. 3, 2006

(30) Foreign Application Priority Data
Jan. 6, 2005 (JP) .......................... P2005-001739

(51) Int. Cl.
*H04B 1/40* (2006.01)
(52) U.S. Cl. .......................... 455/76; 455/85; 455/260; 455/165.1
(58) Field of Classification Search .............. 455/253.2, 455/557, 234.1, 142, 241.1, 136, 192.1, 251.1, 455/550.1, 76, 165.1, 85, 260, 553.1, 214, 455/75, 226.1, 77, 3.01, 336, 150.1; 375/216, 375/147; 370/206, 326
See application file for complete search history.

(56) References Cited

U.S. PATENT DOCUMENTS

| 5,418,815 | A * | 5/1995 | Ishikawa et al. ............. 375/216 |
| 6,281,757 | B1 * | 8/2001 | Tomiyama ................... 330/310 |
| 6,996,156 | B1 * | 2/2006 | Ono ........................... 375/147 |

FOREIGN PATENT DOCUMENTS

JP 05-014133 A 1/1993

\* cited by examiner

*Primary Examiner*—John J Lee
(74) *Attorney, Agent, or Firm*—Lerner, David, Littenberg, Krumholz & Mentlik, LLP (57) ABSTRACT

A high frequency signal receiving device includes a reference frequency signal generating section operable to generate a reference frequency signal; a high frequency signal processing section operable to obtain a signal of a desired channel from a high frequency signal using the reference frequency signal, the high frequency signal being obtained by receiving a broadcast wave; an analog demodulating section operable to subject the signal of the desired channel to an analog demodulation process; and a digital demodulating section operable to subject the signal of the desired channel to a digital demodulation process using the reference frequency signal.

3 Claims, 5 Drawing Sheets

HIGH FREQUENCY SIGNAL RECEIVING DEVICE

CROSS-REFERENCE TO RELATED APPLICATIONS

The present application claims priority from Japanese Patent Application No. JP 2005-001739 filed on Jan. 6, 2005, the disclosure of which is hereby incorporated by reference herein.

BACKGROUND OF THE INVENTION

The present invention relates to a high frequency signal receiving device. Particularly, the present invention can miniaturize a high frequency signal receiving device that can receive the broadcast waves of terrestrial digital television broadcast and terrestrial analog television broadcast by including: reference frequency signal generating means for generating a reference frequency signal; high frequency signal processing means for obtaining a signal of a desired channel from a high frequency signal obtained by receiving a broadcast wave, using the reference frequency signal; analog demodulating means for subjecting the signal obtained by the high frequency signal processing means to an analog demodulation process; and digital demodulating means for subjecting the signal obtained by the high frequency signal processing means to a digital demodulation process using the reference frequency signal.

Figure 4:
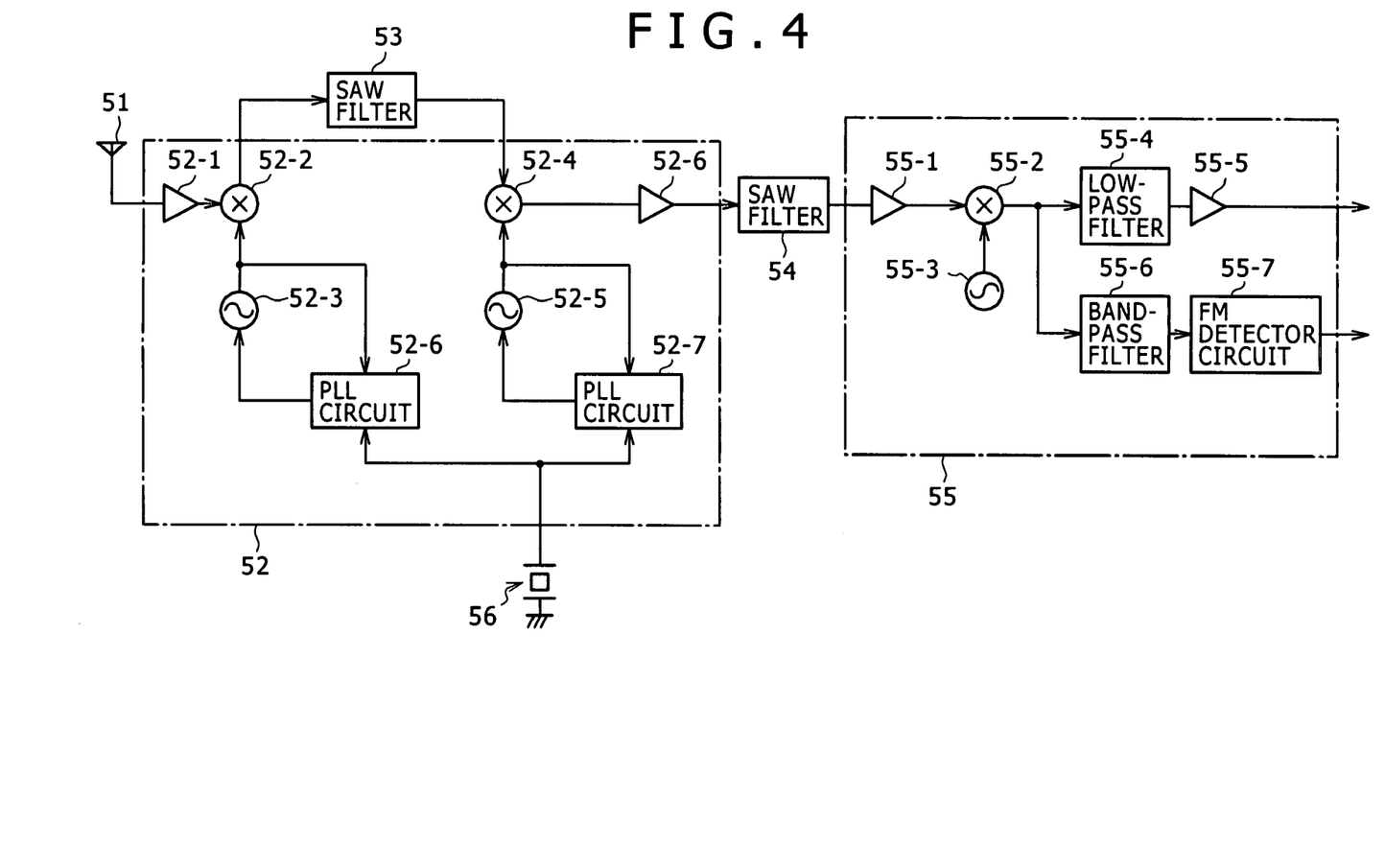
FIG. 4 is a diagram showing a configuration of a high frequency signal receiving device for receiving a terrestrial analog television broadcast.

With recent enhancement of functionality of portable devices, the portable devices can receive the broadcast waves of terrestrial analog television broadcast. FIG. 4 is a diagram showing a configuration of a high frequency signal receiving device used to receive the broadcast waves of terrestrial analog television broadcast.

A high frequency signal obtained by receiving a broadcast wave by a broadcast receiving antenna 51 is amplified to a predetermined signal level by a high frequency amplifier 52-1 in a high frequency signal processing unit 52, and then supplied to a first mixer 52-2. The first mixer 52-2 generates a first intermediate frequency signal of a few GHz by multiplying the signal supplied from the high frequency amplifier 52-1 by an oscillating signal having a frequency corresponding to a selected channel from a first local oscillator circuit 52-3. This first intermediate frequency signal is band-limited by a SAW filter (surface acoustic wave filter) 53, and thereafter supplied to a second mixer 52-4. The second mixer 52-4 generates a second intermediate frequency signal by multiplying the signal supplied from the SAW filter 53 by an oscillating signal supplied from a second local oscillator circuit 52-5. An amplifier 52-8 amplifies the second intermediate frequency signal to a predetermined signal level. The amplifier 52-8 supplies the second intermediate frequency signal to an analog demodulating unit 55 via a SAW filter 54. An intermediate frequency amplifier 55-1 in the analog demodulating unit 55 amplifies the second intermediate frequency signal. The intermediate frequency amplifier 55-1 supplies the amplified second intermediate frequency signal to a video detector 55-2. The video detector 55-2 generates a detection output signal by multiplying the second intermediate frequency signal by an oscillating signal that is supplied from an oscillator circuit 55-3 and has a frequency equal to that of a video carrier. The video detector 55-2 supplies the detection output signal to a low-pass filter 55-4 and a band-pass filter 55-6. The low-pass filter 55-4 obtains an analog video signal by extracting only a low frequency component from the detection output signal. The low-pass filter 55-4 outputs the analog video signal via a video output amplifier 55-5. The band-pass filter 55-6 extracts only a signal component in a predetermined band from the detection output signal. The band-pass filter 55-6 supplies the signal component to an FM detector circuit 55-7. The FM detector circuit 55-7 outputs a baseband analog audio signal obtained by subjecting the signal supplied to the FM detector circuit 55-7 to a detection process. The first local oscillator circuit 52-3 is connected with a PLL circuit 52-6, and the second local oscillator circuit 52-5 is connected with a PLL circuit 52-7. The PLL circuits 52-6 and 52-7 control the oscillating signals generated by the first local oscillator circuit 52-3 and the second local oscillator circuit 52-5 to a desired frequency, using a reference frequency signal generated by a reference frequency signal generating unit 56.

The thus formed high frequency signal receiving device is included in a card-shaped case, as shown in Japanese Patent Laid-Open No. Hei 5-14133, for example. Thus, by only inserting the card-shaped high frequency signal receiving device into the card slot of a portable device, a television broadcast receiving function can be easily added to the portable device.

In broadcast using ground waves, in addition to terrestrial analog television broadcasting, terrestrial digital television broadcasting using an ISDB-T (Integrated Services Digital Broadcasting-Terrestrial) has started. This terrestrial digital television broadcasting uses an OFDM (Orthogonal Frequency Division Multiplexing) system to reduce effects of disturbances caused by multipath (delayed wave) interference, interference from an adjacent channel, and the like. A transmission band of one channel (a frequency bandwidth of 6 MHz) is divided into 13 segments (the bandwidth of one segment is 6/14 MHz). Transmission parameters and information to be transmitted are set in each segment so as to enable high-definition broadcasting, a plurality of standard-definition broadcasts, and terrestrial digital television broadcasting suitable for reception by cars and reception by portable terminals. A central segment of the 13 segments is provided for portable and mobile reception. By performing narrow-band reception in which only the central segment is received, a terrestrial digital television broadcast can be viewed easily on a portable device and the like.

Figure 5:
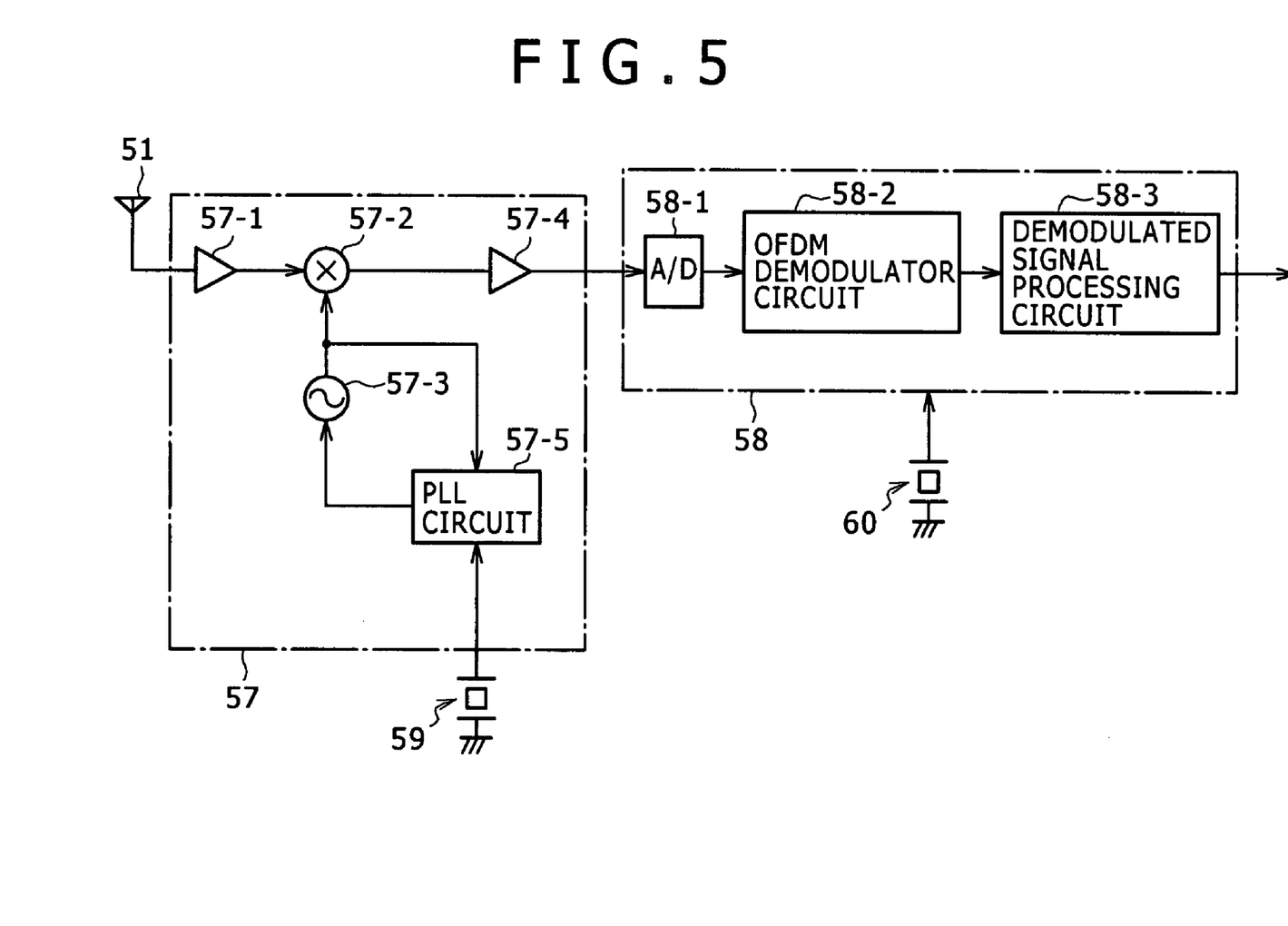
FIG. 5 is a diagram showing a configuration of a high frequency signal receiving device for receiving a terrestrial digital television broadcast.

FIG. 5 shows a configuration of a television receiving device used to receive a terrestrial digital television broadcast. A high frequency signal obtained by receiving a broadcast wave by a broadcast receiving antenna 51 is amplified to a predetermined signal level by a high frequency amplifier 57-1 in a high frequency signal processing unit 57, and then supplied to a mixer 57-2. The mixer 57-2 generates an intermediate frequency signal by multiplying the signal supplied from the high frequency amplifier 57-1 by an oscillating signal having a frequency corresponding to a selected channel from a local oscillator circuit 57-3. The mixer 57-2 supplies the intermediate frequency signal to a digital demodulating unit 58 via an amplifier 57-4. An A/D converter circuit 58-1 in the digital demodulating unit 58 converts the intermediate frequency signal into a digital signal. The A/D converter circuit 58-1 supplies the obtained digital signal to an OFDM demodulator circuit 58-2. The OFDM demodulator circuit 58-2 supplies a demodulated signal obtained by performing OFDM demodulation to a demodulated signal processing circuit 58-3. The demodulated signal processing circuit 58-3 subjects the demodulated signal to an error correction process or the like. The demodulated signal processing circuit 58-3 then outputs the signal as a transport stream. Thus, the high frequency signal processing unit 57 uses a single conversion system, and therefore saves more power than a terrestrial analog television broadcast receiving device using a double conversion system. The local oscillator circuit 57-3 is connected with a PLL circuit 57-5. The PLL circuit 57-5 controls the oscillating signal generated by the local oscillator circuit 57-3 to a desired frequency, using a reference frequency signal generated by a reference frequency signal generating unit 59. The digital demodulating unit 58 operates using a clock signal supplied from a clock signal generating unit 60.

Terrestrial analog television broadcasting has a problem in that a ghost or the like tends to be caused by a delayed wave and disturb a screen in urban districts of a metropolitan area. In addition, a screen tends to be disturbed when a receiving device receives the broadcast wave of a terrestrial analog television broadcast while moving.

On the other hand, terrestrial digital television broadcasting can reduce effects of a delayed wave by inserting guard intervals even when the delayed wave occurs. Terrestrial digital television broadcasting therefore provides images of good quality even when a receiving device receives the broadcast wave of a terrestrial digital television broadcast in an urban area or when a receiving device receives the broadcast wave of a terrestrial digital television broadcast while moving. However, terrestrial digital television broadcasting is performed only in certain areas for the time being. Therefore a mobile device supporting only terrestrial digital television broadcasting cannot receive a television broadcast wave when moving from an area.

Accordingly, it is desirable to provide a high frequency signal receiving device that has a function of receiving terrestrial analog television broadcasts and terrestrial digital television broadcasts and can be miniaturized.

SUMMARY OF THE INVENTION

According to an embodiment of the present invention, there is provided a high frequency signal receiving device including reference frequency signal generating means for generating a reference frequency signal; high frequency signal processing means for obtaining a signal of a desired channel from a high frequency signal using the reference frequency signal, the high frequency signal being obtained by receiving a broadcast wave; analog demodulating means for subjecting the signal of the desired channel to an analog demodulation process; and digital demodulating means for subjecting the signal of the desired channel to a digital demodulation process using the reference frequency signal.

According to an embodiment of the present invention, there is provided a high frequency signal receiving device including high frequency signal processing means for obtaining a signal of a desired channel from a high frequency signal, the high frequency signal being obtained by receiving a broadcast wave of a terrestrial analog television broadcast or a terrestrial digital television broadcast; analog demodulating means for subjecting the signal of the desired channel to an analog demodulation process when a broadcast wave of the terrestrial analog television broadcast is received; digital demodulating means for subjecting the signal of the desired channel to a digital demodulation process when a broadcast wave of the terrestrial digital television broadcast is received; and reference frequency signal generating means for generating a reference frequency signal; wherein the high frequency signal processing means and the digital demodulating means operate using the reference frequency signal generated by the reference frequency signal generating means. In addition, the digital demodulating means generates information indicating a state of reception, and when it is determined based on the information indicating the state of reception that the state of reception has degraded from a predetermined level, power is supplied to the analog demodulating means by power control means. Further, the high frequency signal processing means includes analog broadcast high frequency signal processing means for obtaining a signal of a desired channel in a terrestrial analog television broadcast by performing frequency conversion in a plurality of stages using the reference frequency signal; and digital broadcast high frequency signal processing means for obtaining a signal of a desired channel in a terrestrial digital television broadcast by performing frequency conversion in fewer stages than the plurality of stages using the reference frequency signal. When it is determined based on the information indicating the state of reception that the state of reception has degraded from a predetermined level, power is supplied to the analog broadcast high frequency signal processing means and the analog demodulating means in place of the digital broadcast high frequency signal processing means.

According to an embodiment of the present invention, there is provided a high frequency signal receiving device including reference frequency signal generating means for generating a reference frequency signal; high frequency signal processing means for obtaining a signal of a desired channel from a high frequency signal using the reference frequency signal, the high frequency signal being obtained by receiving a broadcast wave; analog demodulating means for subjecting the signal of the desired channel to an analog demodulation process; and digital demodulating means for subjecting the signal of the desired channel to a digital demodulation process using the reference frequency signal. The high frequency signal processing means and the digital demodulating means thus operate using the reference frequency signal generated by the reference frequency signal generating means. Therefore, the need to generate a reference signal in each of the high frequency signal processing means and the digital demodulating means is eliminated, so that the high frequency signal receiving device capable of receiving the broadcast waves of terrestrial analog television broadcasts and terrestrial digital television broadcasts can be miniaturized.

In addition, the digital demodulating means generates information indicating a state of reception, and when it is determined based on the information indicating the state of reception that the state of reception has degraded from a predetermined level, power is supplied to the analog demodulating means. Thus, when a terrestrial digital television broadcast cannot be received well, a terrestrial analog television broadcast can be viewed. Also, when a terrestrial digital television broadcast is received well, power supply to the analog demodulating means is stopped, so that power consumption when the terrestrial digital television broadcast is viewed can be reduced.

In addition, the high frequency signal processing means includes analog broadcast high frequency signal processing means for obtaining a signal of a desired channel in a terrestrial analog television broadcast by performing frequency conversion in a plurality of stages using the reference frequency signal, and for supplying the signal to the analog demodulating means; and digital broadcast high frequency signal processing means for obtaining a signal of a desired channel in a terrestrial digital television broadcast by performing frequency conversion in fewer stages than the plurality of stages using the reference frequency signal, and for supplying the signal to the digital demodulating means. Therefore, a terrestrial analog television broadcast and a terrestrial digital television broadcast can be received simultaneously so that different programs can be viewed simultaneously, or so that a terrestrial analog television broadcast program can be viewed while a data broadcast performed in terrestrial digital television broadcasting is received.

Further, when it is determined based on the information indicating the state of reception that the state of reception has degraded from a predetermined level during power supply to the digital broadcast high frequency signal processing means, power is supplied to the analog broadcast high frequency signal processing means and the analog demodulating means in place of the digital broadcast high frequency signal processing means. The digital broadcast high frequency signal processing means obtains a signal of a desired channel in a terrestrial digital television broadcast by performing frequency conversion in fewer stages than the analog broadcast high frequency signal processing means, and thus consumes less power than the analog broadcast high frequency signal processing means. Thus, power consumption when a terrestrial digital television broadcast is viewed can be further reduced as compared with a case in which high frequency signal processing means is shared for terrestrial analog television broadcasts and terrestrial digital television broadcasts.

DETAILED DESCRIPTION

Figure 1:
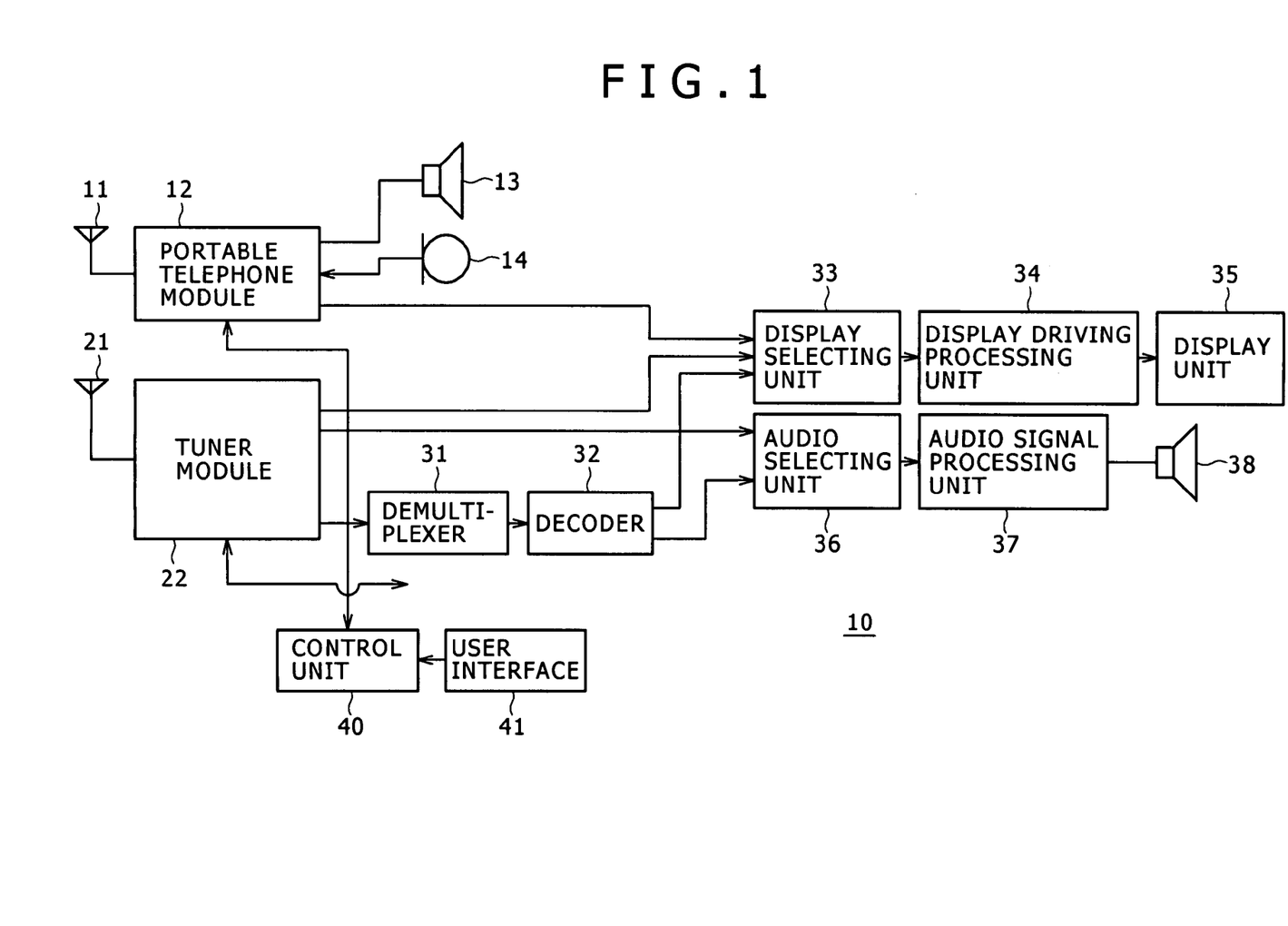
FIG. 1 is a diagram showing a configuration of a portable telephone terminal.

Preferred embodiments of the present invention will hereinafter be described with reference to the drawings. FIG. 1 shows a high frequency signal receiving device for example modularized and included in a portable telephone terminal.

A communication antenna 11 for radio communication in the portable telephone terminal 10 is connected to a portable telephone module 12. The portable telephone module 12 is also connected with a telephone receiver 13 and a telephone transmitter 14. The portable telephone module 12 includes for example a high frequency signal processing unit for generating a signal to be transmitted from the communication antenna 11 and processing a signal received by the communication antenna 11, a baseband signal processing unit for processing baseband signals of audio data, information data and the like, and an audio codec for performing audio band compression.

This portable telephone module 12 connects to a portable telephone network in response to a dialing operation on a key operating unit, an incoming call response operation, or the like, to allow telephone conversation between a user of the portable telephone terminal 10 and another person that the user intends to talk to using the telephone receiver 13 and the telephone transmitter 14. The portable telephone module 12 also supplies a display signal to a display selecting unit 33 to be described later. The portable telephone module 12 has a display unit 35 make display based on the display signal to perform for example a process for producing and transmitting electronic mail using the display on the display unit 35, a process for receiving electronic mail for the portable telephone terminal 10 and displaying the electronic mail on the display unit 35, and a process for browsing Web pages. Incidentally, the transmission and reception of electronic mail and the browsing of Web pages are performed by connecting to the Internet via the portable telephone network.

A broadcast receiving antenna 21 for receiving broadcast waves is connected to a tuner module 22 as high frequency signal receiving device. The tuner module 22 receives terrestrial analog television broadcast and terrestrial digital television broadcast. The tuner module 22 supplies a video signal obtained by receiving a terrestrial analog television broadcast to the display selecting unit 33, and supplies an audio signal to an audio selecting unit 36. The tuner module 22 supplies a transport stream obtained by receiving the broadcast wave of a terrestrial digital television broadcast to a demultiplexer 31.

The demultiplexer 31 extracts video data and audio data of a broadcast program from the transport stream supplied to the demultiplexer 31. The demultiplexer 31 supplies the video data and the audio data to a decoder 32. The decoder 32 subjects the video data and the audio data supplied to the decoder 32 to a decompression process and the like to reconstruct video data and audio data before compression coding. The decoder 32 then supplies the reconstructed video data to the display selecting unit 33, and supplies the reconstructed audio data to the audio selecting unit 36.

The display selecting unit 33 selects a display signal supplied from the portable telephone module 12 when the user selects a telephone function, and supplies the display signal to a display driving processing unit 34. When the user selects a television receiving function, the display selecting unit 33 selects a video signal supplied from the tuner module 22 or video data supplied from the decoder 32, and supplies the video signal or the video data to the display driving processing unit 34.

The display driving processing unit 34 generates a display driving signal on the basis of the display signal, the video signal, or the video data selected by the display selecting unit 33. The display driving processing unit 34 supplies the display driving signal to the display unit 35. The display unit 35 is formed by using a display element such as an LCD (Liquid Crystal Display), an organic EL (Electro-Luminescence) display or the like. The display unit 35 drives the display element on the basis of the display driving signal supplied from the display driving processing unit 34 to display information related to a telephone function, for example a telephone directory list, electronic mail to be transmitted, received electronic mail, Web page information, various other guidance information and message information, and the like. The display unit 35 also displays the video of a received terrestrial analog television broadcast or terrestrial digital television broadcast program.

The audio selecting unit 36 selects an audio signal supplied from the tuner module 22 or audio data supplied from the decoder 32. The audio selecting unit 36 supplies the audio signal or the audio data to an audio signal processing unit 37. The audio signal processing unit 37 for example adjusts sound volume by changing the signal level of the audio signal, and supplies the audio signal having a desired signal level to an audio output unit 38. Incidentally, when the audio data is supplied to the audio signal processing unit 37, the audio signal processing unit 37 also performs a process of converting the audio data into an analog audio signal. The audio output unit 38 is formed by a speaker or the like. The audio output unit 38 outputs the audio of the received broadcast program on the basis of the audio signal supplied to the audio output unit 38.

A control unit 40 is connected with a user interface 41. When an operation signal corresponding to a telephone operation, a channel selecting operation or the like by the user is supplied from the user interface 41, the control unit 40 generates a control signal so that the operation of the portable telephone terminal corresponds to the user operation. The control unit 40 supplies the control signal to the portable telephone module 12, the tuner module 22 and the like. For example, when a telephone function is selected and a calling operation or the like is performed on the user interface 41, the portable telephone module 12 is used to perform for example a process of line connection to another terminal desired to be called. When a television receiving function is selected and a channel operation or the like is performed on the user interface 41, the tuner module 22 is used to perform a process so that a desired television program can be viewed.

Figure 2:
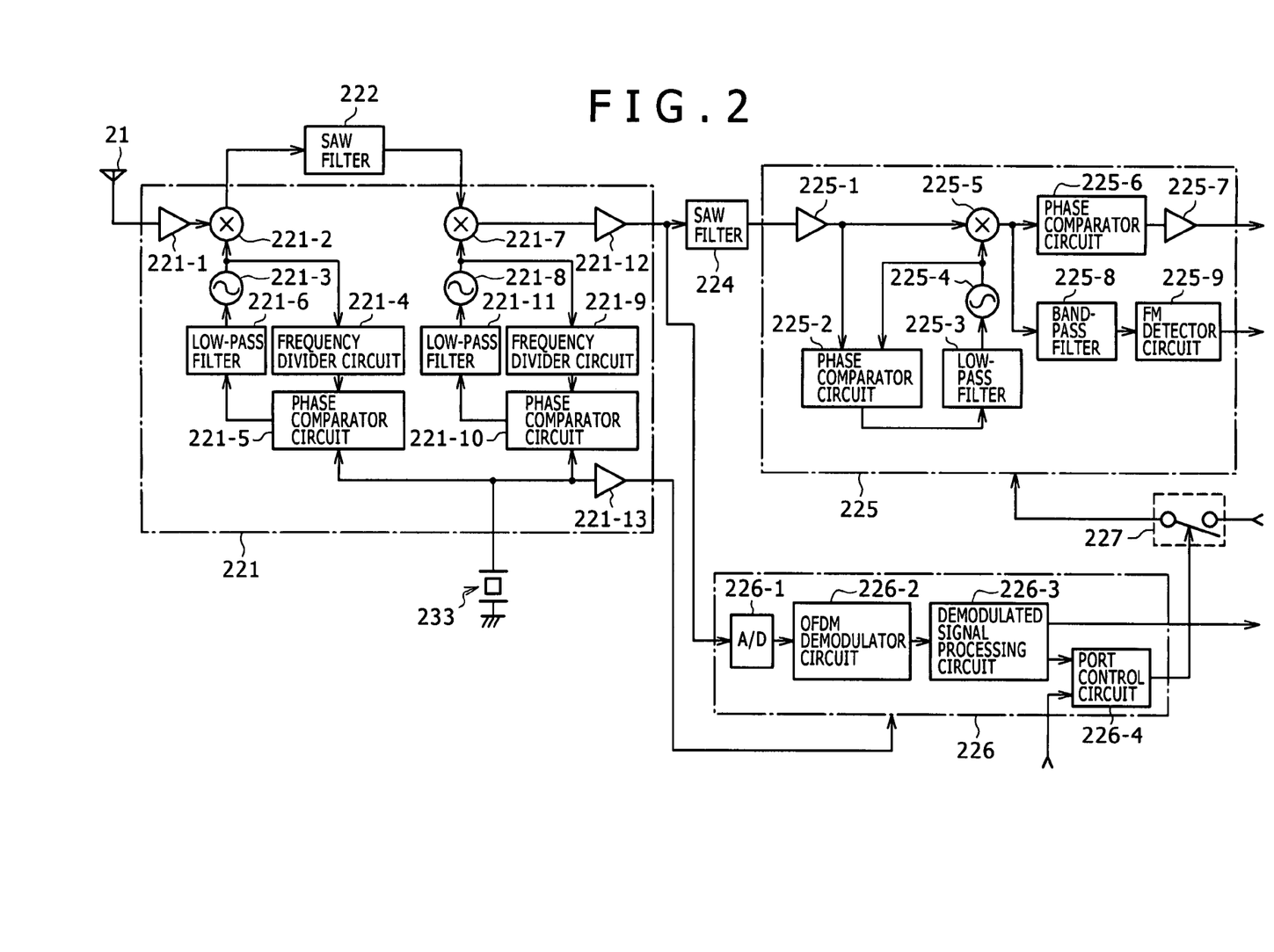
FIG. 2 is a diagram showing a configuration of a tuner module.

FIG. 2 shows a configuration of the tuner module. The tuner module 22 has a high frequency signal processing unit 221, SAW filter 222 and 224, a reference frequency signal generating unit 223, an analog demodulating unit 225, a digital demodulating unit 226, and a power supply selector switch 227.

A high frequency signal obtained by receiving a broadcast wave by the broadcast receiving antenna 21 is supplied to the high frequency signal processing unit 221. Incidentally, the high frequency signal processing unit 221 shown in FIG. 2 illustrates a configuration using a double superheterodyne system (up/down converter system).

A high frequency amplifier 221-1 in the high frequency signal processing unit 221 amplifies the high frequency signal supplied from the broadcast receiving antenna 21 to a desired signal level. The high frequency amplifier 221-1 supplies the high frequency signal to a first mixer 221-2.

The first mixer 221-2 is supplied with an oscillating signal having a frequency corresponding to a selected channel from a first local oscillator circuit 221-3. The first mixer 221-2 generates a signal upconverted to a frequency of for example 1.2 GHz by multiplying the high frequency signal supplied from the high frequency amplifier 221-1 by the oscillating signal from the first local oscillator circuit 221-3. The first mixer 221-2 supplies the upconverted signal to the SAW filter 222. The SAW filter 222 subjects the signal supplied from the first mixer 221-2 to a band limitation, and thereby removes unnecessary components. The SAW filter 222 supplies the resulting signal to a second mixer 221-7.

By thus upconverting the signal received by the broadcast receiving antenna 21, supplying the upconverted signal to the SAW filter 222, and subjecting the signal to a band limitation, it is possible to extract a desired signal efficiently without using an air-core coil or the like. Therefore the tuner module can be miniaturized.

The first local oscillator circuit 221-3 supplies the generated oscillating signal to the first mixer 221-2 and a frequency divider circuit 221-4. The frequency divider circuit 221-4, in conjunction with a phase comparator circuit 221-5 and a low-pass filter 221-6 to be described later, forms a PLL circuit. The frequency divider circuit 221-4 divides the frequency of the oscillating signal with a frequency dividing ratio corresponding to a channel selecting instruction included in a control signal from the control unit 40. The frequency divider circuit 221-4 supplies the resulting oscillating signal to the phase comparator circuit 221-5.

The phase comparator circuit 221-5 is supplied with a reference frequency signal from the reference frequency signal generating unit 223. The phase comparator circuit 221-5 compares the phases of the reference frequency signal and the signal supplied from the frequency divider circuit 221-4 with each other. The phase comparator circuit 221-5 supplies a result of the comparison to the first local oscillator circuit 221-3 via the low-pass filter 221-6. Thus, the oscillating signal generated by the first local oscillator circuit 221-3 has a frequency corresponding to a selected channel and is synchronous with the reference frequency signal.

A second mixer 221-7 is supplied with an oscillating signal from a second local oscillator circuit 221-8. The second mixer 221-7 converts the signal supplied from the SAW filter 222 into an intermediate frequency signal by multiplying the signal supplied from the SAW filter 222 by the oscillating signal supplied from the second local oscillator circuit 221-8. The second mixer 221-7 outputs the converted signal via an amplifier 221-12.

The second local oscillator circuit 221-8 supplies the generated oscillating signal to the second mixer 221-7 and a frequency divider circuit 221-9. The frequency divider circuit 221-9, in conjunction with a phase comparator circuit 221-10 and a low-pass filter 221-11 to be described later, forms a PLL circuit. The frequency divider circuit 221-9 divides the frequency of the oscillating signal. The frequency divider circuit 221-9 supplies the resulting oscillating signal to the phase comparator circuit 221-10.

The phase comparator circuit 221-10 is supplied with the reference frequency signal from the reference frequency signal generating unit 223. The phase comparator circuit 221-10 compares the phases of the reference frequency signal and the signal supplied from the frequency divider circuit 221-9 with each other. The phase comparator circuit 221-10 supplies a result of the comparison to the second local oscillator circuit 221-8 via the low-pass filter 221-11. Thus, by controlling a frequency dividing ratio in the frequency divider circuit 221-9, the signal supplied from the SAW filter 222 can be converted into an intermediate frequency signal by the second mixer 221-7. The oscillating signal output from the second local oscillator circuit 221-8 is synchronous with the reference frequency signal from the reference frequency signal generating unit 223.

Thus, the high frequency signal processing unit 221 generates an intermediate frequency signal of a desired channel at a time of receiving a terrestrial analog television broadcast. At a time of receiving a terrestrial digital television broadcast, the high frequency signal processing unit 221 performs a narrow band reception for receiving a central segment of a desired channel, and generates an intermediate frequency signal.

The intermediate frequency signal generated by the high frequency signal processing unit 221 is supplied to the analog demodulating unit 225 via the SAW filter 224. The intermediate frequency signal is also supplied to the digital demodulating unit 226 without being passed through the SAW filter 224. Further, the reference frequency signal generated by the reference frequency signal generating unit 223 is supplied to the digital demodulating unit 226 via an amplifier 221-13 of the high frequency signal processing unit 221.

The analog demodulating unit 225 shown in FIG. 2 illustrates a configuration using a synchronous detection system. An intermediate frequency amplifier 225-1 in the analog demodulating unit 225 amplifies the intermediate frequency signal supplied via the SAW filter 224 to a predetermined signal level. The intermediate frequency amplifier 225-1 supplies the amplified intermediate frequency signal to a phase comparator circuit 225-2 and a video detector 225-5.

The phase comparator circuit 225-2 compares the phases of the intermediate frequency signal and an oscillating signal generated by an oscillator circuit 225-4 with each other. The phase comparator circuit 225-2 supplies a result of the comparison to the oscillator circuit 225-4 via a low-pass filter 225-3. Thus, the oscillator circuit 225-4 generates the oscillating signal that has a frequency equal to that of a video carrier and has a phase synchronous with that of the video carrier.

The video detector 225-5 generates a detection output signal by shifting the phase of the oscillating signal supplied from the oscillator circuit 225-4 by $\pi/2$ and multiplying the oscillating signal by the intermediate frequency signal. The video detector 225-5 supplies the generated detection output signal to a low-pass filter 225-6 and a band-pass filter 225-8.

The low-pass filter 225-6 obtains an analog video signal SVa by extracting only a low frequency component from the detection output signal. This analog video signal SVa is amplified by a video output amplifier 225-7 and then supplied to the display selecting unit 33.

The band-pass filter 225-8 extracts only a signal component in a predetermined band from the detection output signal. The band-pass filter 225-8 supplies the signal component to an FM detector circuit 225-9. The FM detector circuit 225-9 supplies the audio selecting unit 36 with a baseband analog audio signal SAa obtained by subjecting the signal supplied to the FM detector circuit 225-9 to a detection process.

Incidentally, while the analog demodulating unit 225 generates the oscillating signal that has a frequency equal to that of the video carrier and has a phase synchronous with that of the video carrier using the intermediate frequency signal, the oscillating signal that has a frequency equal to that of the video carrier and has a phase synchronous with that of the video carrier may be generated using the reference frequency signal generated by the reference frequency signal generating unit 223.

The digital demodulating unit 226 is formed by using an A/D converter circuit 226-1, an OFDM demodulator circuit 226-2, a demodulated signal processing circuit 226-3, and a port control circuit 226-4. The digital demodulating unit 226 operates using the reference frequency signal supplied from the amplifier 221-13 of the high frequency signal processing unit 221, and the like.

The A/D converter circuit 226-1 in the digital demodulating unit 226 converts the intermediate frequency signal supplied from the high frequency signal processing unit 221 into a digital signal. The A/D converter circuit 226-1 supplies the digital signal to the OFDM demodulator circuit 226-2.

The OFDM demodulator circuit 226-2 supplies the demodulated signal processing circuit 226-3 with an OFDM demodulated signal obtained by subjecting the digital signal supplied from the A/D converter circuit 226-1 to an OFDM demodulation process. The demodulated signal processing circuit 226-3 subjects the supplied OFDM demodulated signal to an error detection and correction process. The demodulated signal processing circuit 226-3 also decodes a TMCC (Transmission and Multiplexing Configuration Control) signal multiplexed in the broadcast signal. The demodulated signal processing circuit 226-3 thereby obtains a transport stream including video data packets and audio data packets of a desired terrestrial digital television broadcast. The demodulated signal processing circuit 226-3 supplies the transport stream to the demultiplexer 31. In addition, the demodulated signal processing circuit 226-3 supplies the port control circuit 226-4 with information indicating a state of reception, for example an error rate obtained when the error detection and correction process is performed, and information indicating whether the decoding of the TMCC signal is completed properly. The port control circuit 226-4 generates a power supply control signal on the basis of for example the information indicating a state of reception or a control signal supplied from the control unit 40. The port control circuit 226-4 supplies the power supply control signal from an output port to the power supply selector switch 227 to control the operation of the power supply selector switch 227.

The port control circuit 226-4 and the power supply selector switch 227 form power supply controlling means. In the tuner module shown in FIG. 2, the digital demodulating unit 226, which consumes low power, includes the port control circuit 226-4. In this case, when the digital demodulating unit 226 is formed into an integrated circuit, the integrated circuit includes the port control circuit 226-4. Therefore a need for a board space for the port control circuit 226-4 is eliminated, so that the portable telephone terminal can be further miniaturized.

Thus, in the tuner module 22, the reference frequency signal used in the high frequency signal processing unit 221 is also used in the digital demodulating unit 226. It is therefore not necessary to provide an oscillator circuit in the digital demodulating unit 226, so that the tuner module 22 can be miniaturized. In addition, since the circuit for receiving terrestrial digital television broadcast and the circuit for receiving terrestrial analog television broadcast are integrally modularized, it is easy to optimize routing from the antenna to the high frequency circuit. The tuner module can be made less susceptible to interference by noise caused by the telephone module or the like when a television broadcast wave is received.

Further, power supply to the analog demodulating unit 225 in the tuner module 22 is performed on the basis of the power supply control signal. Specifically, when the error rate obtained in the error detection and correction process in the demodulated signal processing circuit 226-3 does not exceed a predetermined level, and when the decoding of the TMCC signal in the demodulated signal processing circuit 226-3 is completed properly, the port control circuit 226-4 determines that the state of reception is better than a predetermined level. The port control circuit 226-4 controls the power supply selector switch 227 by the power supply control signal so as not to supply power to the analog demodulating unit 225. When the error rate exceeds the predetermined level, and when the decoding of the TMCC signal is not completed properly, the port control circuit 226-4 determines that the state of reception has degraded from the predetermined level. The port control circuit 226-4 controls the power supply selector switch 227 by the power supply control signal so as to supply power to the analog demodulating unit 225. Further, when power is supplied to the analog demodulating unit 225, a channel changing process is performed by the control unit 40, for example, so as to receive a terrestrial analog television broadcast by the high frequency signal processing unit 221. When the channel numbers of terrestrial digital television broadcast and terrestrial analog television broadcast are registered in advance in association with each other, an automatic change can be made from a viewed channel of terrestrial digital television broadcast to an associated channel of terrestrial analog television broadcast.

The generation of the power supply control signal may be controlled by the control unit 40 formed by using a microcomputer or the like. Specifically, the control unit 40 reads the error rate obtained in the error detection and correction process and a result of the decoding of the TMCC signal in the demodulated signal processing circuit 226-3 in order to determine whether the state of reception has degraded from the predetermined level. The control unit 40 generates a control signal on the basis of a result of the determination. The control unit 40 supplies the control signal to the port control circuit

226-4. The port control circuit 226-4 generates the power supply control signal on the basis of the control signal supplied from the control unit 40. Such a constitution can simplify the configuration of the port control circuit 226-4. In addition, a reference level for determining whether the state of reception has degraded can be set freely by the control unit 40. When the state of reception is thus determined by the control unit 40, the power supply controlling means includes the control unit 40.

Incidentally, when the broadcast to be received is fixed to terrestrial digital television broadcast or terrestrial analog television broadcast by a user operation, the power supply control signal based on a control signal that is supplied from the control unit 40 and corresponds to the user operation is supplied to the power supply selector switch 227 to supply power so that a desired broadcast can be received.

Further, though not shown in the figure, signals selected by the display selecting unit 33 and the audio selecting unit 36 are changed in such a manner as to be interlocked with the operation of controlling the power supply selector switch 227. Specifically, when power is not supplied to the analog demodulating unit 225, signals output from the decoder 32 are selected. When power is supplied to the analog demodulating unit 225, signals output from the analog demodulating unit 225 are selected. By thus changing the selected signals, a broadcast program on a channel selected by the high frequency signal processing unit 221 can be viewed. Incidentally, signals selected by the display selecting unit 33 and the audio selecting unit 36 may be changed under control of the port control circuit 226-4 or under control of the control unit 40.

Thus, when power supply to the analog demodulating unit 225 and the like are controlled as described above according to the state of reception, and a terrestrial digital television broadcast is received well, power supply to the analog demodulating unit 225 is stopped, so that power consumption can be reduced. In addition, even when the state of reception has degraded from the predetermined level during the reception of a terrestrial digital television broadcast, a program received as a terrestrial analog television broadcast can be automatically presented. Hence, the user can view a television program with a high image quality even while moving within a service area of terrestrial digital television broadcast, for example, and can view a program of terrestrial analog television broadcast even outside the service area.

Further, the portable telephone module 12 may be used to communicate with a radio base station so that power supply to the analog demodulating unit 225 is controlled on the basis of a result of determination of whether the position of the portable telephone terminal is within the service area of terrestrial digital television broadcast. In this case, when for example the control unit 40 determines that the position of the portable telephone terminal is within the service area of terrestrial digital television broadcast, the port control circuit 226-4 generates the power supply control signal on the basis of a control signal from the control unit 40 to stop power supply to the analog demodulating unit 225 by controlling the power supply selector switch 227. When the position of the portable telephone terminal is not within the service area of terrestrial digital television broadcast, power is supplied to the analog demodulating unit 225 to present a program of terrestrial analog television broadcast.

The above-described high frequency signal processing unit 221 uses the double superheterodyne system in which frequency conversion is performed in two stages. However, using a system in which the number of stages of frequency conversion is smaller than in the double superheterodyne system, for example a single conversion system in which frequency conversion is performed in one stage when the broadcast wave of terrestrial digital television broadcast is received can simplify a circuit configuration as compared with the case where the double superheterodyne system is used, and reduce power consumption.

Accordingly, a high frequency signal processing unit used to receive the broadcast wave of terrestrial analog television broadcast (hereinafter referred to as an "analog broadcast high frequency signal processing unit") and a high frequency signal processing unit used to receive the broadcast wave of terrestrial digital television broadcast (hereinafter referred to as a "digital broadcast high frequency signal processing unit") are provided separately, and the digital broadcast high frequency signal processing unit has a circuit configuration that consumes low power. Such a configuration of the high frequency signal processing units can further reduce power consumption when a terrestrial digital television broadcast is viewed.

Figure 3:
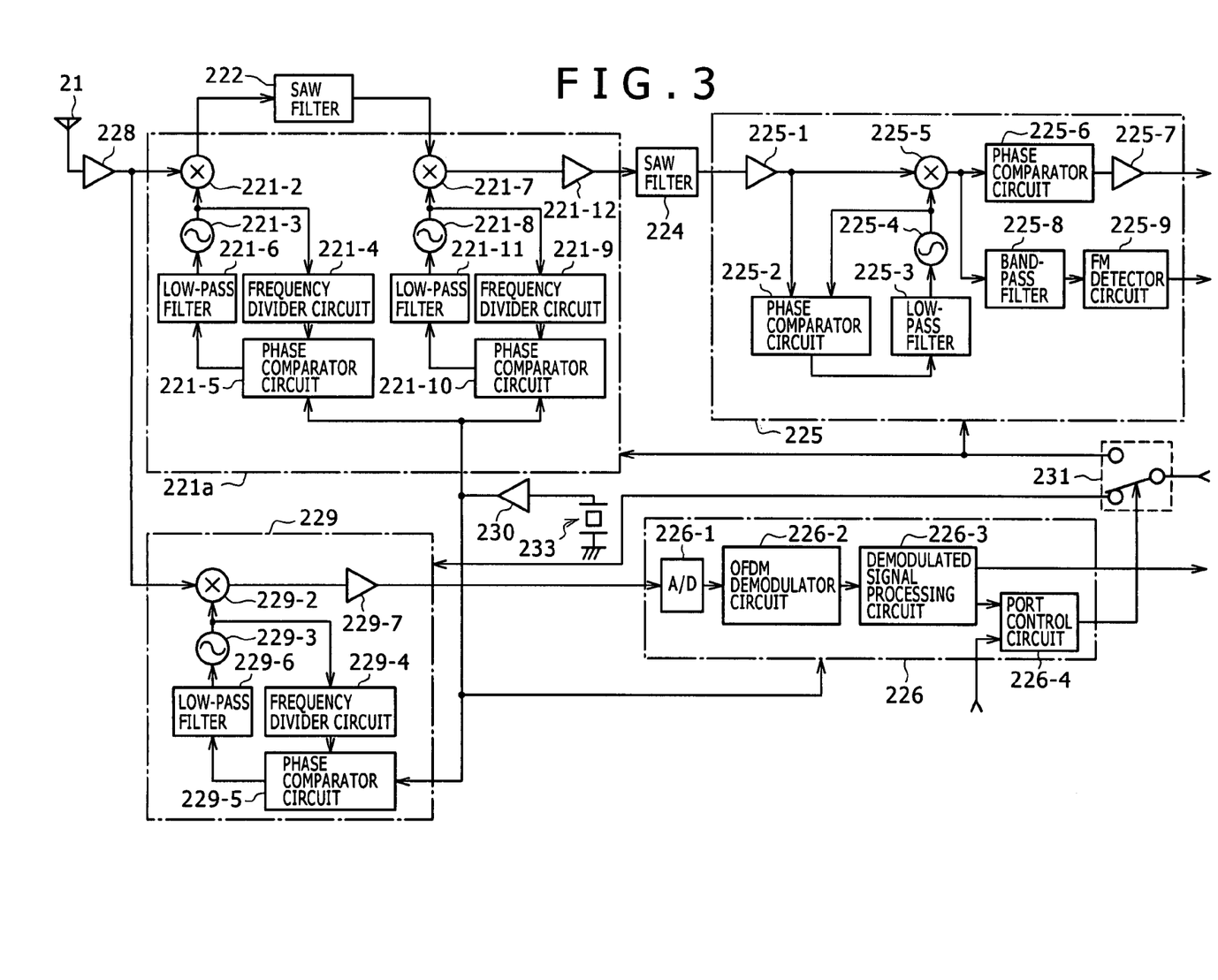
FIG. 3 is a diagram showing another configuration of a tuner module.

FIG. 3 shows a configuration of a tuner module when a high frequency signal processing unit used to receive the broadcast wave of terrestrial analog television broadcast and a high frequency signal processing unit used to receive the broadcast wave of terrestrial digital television broadcast are provided separately. Incidentally, in FIG. 3, parts corresponding to those of FIG. 2 are identified by the same reference numerals, and detailed description thereof will be omitted.

A high frequency amplifier 228 amplifies a high frequency signal obtained by receiving a broadcast wave by the broadcast receiving antenna 21 to a predetermined signal level. The high frequency amplifier 228 supplies the amplified high frequency signal to a first mixer 221-2 in an analog broadcast high frequency signal processing unit 221*a* and a mixer 229-2 in a digital broadcast high frequency signal processing unit 229.

The mixer 229-2 is supplied with an oscillating signal from a local oscillator circuit 229-3. The mixer 229-2 multiplies the high frequency signal supplied from the high frequency amplifier 228 by the oscillating signal supplied from the local oscillator circuit 229-3 to down-convert the high frequency signal. The mixer 229-2 thereby generates an intermediate frequency signal. The mixer 229-2 supplies the generated intermediate frequency signal to a digital demodulating unit 226 via an amplifier 229-7.

The local oscillator circuit 229-3 supplies the generated oscillating signal to the mixer 229-2 and a frequency divider circuit 229-4. The frequency divider circuit 229-4, in conjunction with a phase comparator circuit 229-5 and a low-pass filter 229-6 to be described later, forms a PLL circuit. The frequency divider circuit 229-4 divides the frequency of the oscillating signal with a frequency dividing ratio corresponding to a channel selecting instruction included in a control signal from the control unit 40. The frequency divider circuit 229-4 supplies the resulting oscillating signal to the phase comparator circuit 229-5.

The phase comparator circuit 229-5 is supplied with a reference frequency signal from a reference frequency signal generating unit 223 via an amplifier 230. The phase comparator circuit 229-5 compares the phases of the reference frequency signal and the signal supplied from the frequency divider circuit 229-4 with each other. The phase comparator circuit 229-5 supplies a result of the comparison to the local oscillator circuit 229-3 via the low-pass filter 229-6. Thus, the oscillating signal generated by the local oscillator circuit 229-3 has a frequency corresponding to a selected channel and is synchronous with the reference frequency signal.

The reference frequency signal generating unit 223 supplies the generated reference frequency signal to phase comparator circuits 221-5 and 221-10 in the analog broadcast high frequency signal processing unit 221a, the phase comparator circuit 229-5 in the digital broadcast high frequency signal processing unit 229, and the digital demodulating unit 226 via the amplifier 230.

Power to the analog broadcast high frequency signal processing unit 221a and an analog demodulating unit 225, or the digital broadcast high frequency signal processing unit 229 is supplied via a power supply selector switch 231.

The power supply selector switch 231 performs switching on the basis of a result of error detection and a result of decoding a TMCC signal in a demodulated signal processing circuit 226-3 as described above, or a control signal from the control unit 40, for example. Specifically, when the result of error detection in the demodulated signal processing circuit 226-3 does not exceed a predetermined error rate, and when the decoding of the TMCC signal is completed in the demodulated signal processing circuit 226-3, the power supply selector switch 231 is controlled by a power supply control signal from a port control circuit 226-4 so as not to supply power to the analog broadcast high frequency signal processing unit 221a and the analog demodulating unit 225. When the result of error detection exceeds the predetermined error rate, and when the decoding of the TMCC signal cannot be completed, the power supply selector switch 231 is controlled by the power supply control signal from the port control circuit 226-4 so as to supply power to the analog broadcast high frequency signal processing unit 221a and the analog demodulating unit 225 and so as not to supply power to the digital broadcast high frequency signal processing unit 229. Further, signals selected by the display selecting unit 33 and the audio selecting unit 36 are changed in such a manner as to be interlocked with the operation of controlling the power supply selector switch 231. Specifically, when power is not supplied to the analog broadcast high frequency signal processing unit 221a and the analog demodulating unit 225, signals supplied from the decoder 32 are selected. When power is supplied to the analog broadcast high frequency signal processing unit 221a and the analog demodulating unit 225, signals from the analog demodulating unit 225 are selected.

Thus, when the analog broadcast high frequency signal processing unit 221a and the digital broadcast high frequency signal processing unit 229 are provided separately from each other, and power supply is changed by the power supply selector switch 231, the digital broadcast high frequency signal processing unit 229 consuming less power than the analog broadcast high frequency signal processing unit 221a is used during the reception of terrestrial digital television broadcast, so that the power consumption of the portable telephone terminal can be further reduced.

In the tuner module shown in FIG. 3, the digital demodulating unit 226 includes the port control circuit 226-4. When the digital demodulating unit 226 is formed into an integrated circuit with the digital demodulating unit 226 including the port control circuit 226-4, power supply to the digital demodulating unit 226 needs to be maintained in order to control the power supply selector switch. Thus, when the port control circuit 226-4 is provided separately from the digital demodulating unit 226, and power supply to the digital broadcast high frequency signal processing unit 229 and the digital demodulating unit 226 is stopped during power supply to the analog broadcast high frequency signal processing unit 221a and the analog demodulating unit 225, power consumption during the reception of a terrestrial analog television broadcast can be further reduced.

When the analog broadcast high frequency signal processing unit 221a and the digital broadcast high frequency signal processing unit 229 are provided separately from each other, and power is supplied to each of the analog broadcast high frequency signal processing unit 221a, the analog demodulating unit 225, the digital demodulating unit 226, and the digital broadcast high frequency signal processing unit 229, a terrestrial digital television broadcast and a terrestrial analog television broadcast can be received simultaneously. At this time, the display selecting unit 33 selects both signals supplied from the analog demodulating unit 225 and signals supplied from the decoder 32, and supplies both the signals supplied from the analog demodulating unit 225 and the signals supplied from the decoder 32 to the display driving processing unit 34, whereby the terrestrial digital television broadcast program and the terrestrial analog television broadcast program can be displayed simultaneously on the display unit 35. In addition, terrestrial digital television broadcast provides not only moving images and audio but also data service. Therefore, when the decoder 32 extracts data information and supplies the data information to the display driving processing unit 34 via the display selecting unit 33, the user can obtain the data information provided by terrestrial digital television broadcast, for example VICS (Vehicle Information and Communication System) information while viewing a program of terrestrial analog television broadcast. Thus the functionality of the portable telephone terminal can be enhanced.

It is to be noted that while in the above-described embodiment, the analog broadcast high frequency signal processing unit uses a double superheterodyne system, and the digital broadcast high frequency signal processing unit uses a single conversion system, the demodulating systems are not limited to these systems. For example, when the digital broadcast high frequency signal processing unit is formed by using a direct conversion system that can generate a baseband signal from a high frequency signal obtained by receiving a broadcast wave by the broadcast receiving antenna 21 without generating an intermediate frequency signal, as a system for performing frequency conversion in fewer stages than analog broadcast high frequency signal processing means, no SAW filter is required, so that the number of parts can be reduced and thus the portable telephone terminal can be further miniaturized. Since it suffices to receive one segment in receiving a terrestrial digital television broadcast, a signal in one segment band can be converted into a baseband signal without being distorted even when the direct conversion system is used.

While in the foregoing embodiments, description has been made of cases where a high frequency signal receiving device is applied to a portable telephone terminal, the high frequency signal receiving device may of course be applied to electronic devices having a display element and an output terminal for outputting a reproduced audio signal such as a speaker, a headphone terminal or the like, such for example as PDAs (Personal Digital Assistants), notebook personal computer devices, digital still cameras mainly for picking up still images, and digital video cameras mainly for taking moving images.

As described above, the high frequency signal receiving device according to the present invention is suitable for reception of television broadcast waves in portable type electronic devices and the like.

It should be understood by those skilled in the art that various modifications, combinations, sub-combinations and alterations may occur depending on design requirements and other factors insofar as they are within the scope of the appended claims or the equivalents thereof.

The invention claimed is:

1. A high frequency signal receiving device, comprising:
reference frequency signal generating means for generating a reference frequency signal;
high frequency signal processing means for obtaining a signal of a desired channel from a high frequency signal using the reference frequency signal, the high frequency signal being obtained by receiving a broadcast wave;
analog demodulating means for subjecting the signal of the desired channel to an analog demodulation process;
digital demodulating means for subjecting the signal of the desired channel to a digital demodulation process using the reference frequency signal; and
power supply controlling means for controlling power supplied to the analog demodulating means, wherein
the digital demodulating means generates information indicating a state of reception, and
when the power supply controlling means determines based on the information indicating the state of reception that the state of reception has degraded from a predetermined level, the power supply controlling means supplies power to the analog demodulating means.

2. A high frequency signal receiving device, comprising:
reference frequency signal generating means for generating a reference frequency signal;
high frequency signal processing means for obtaining a signal of a desired channel from a high frequency signal using the reference frequency signal, the high frequency signal being obtained by receiving a broadcast wave;
analog demodulating means for subjecting the signal of the desired channel to an analog demodulation process;
digital demodulating means for subjecting the signal of the desired channel to a digital demodulation process using the reference frequency signal;
analog broadcast high frequency signal processing means for obtaining a signal of a desired channel in a terrestrial analog television broadcast by performing frequency conversion in a plurality of stages using the reference frequency signal, and for supplying the signal to the analog demodulating means; and
digital broadcast high frequency signal processing means for obtaining a signal of a desired channel in a terrestrial digital television broadcast by performing frequency conversion in fewer stages than the plurality of stages using the reference frequency signal, and for supplying the signal to the digital demodulating means.

3. The high frequency signal receiving device as claimed in claim 2, further comprising:
power supply controlling means for controlling power supplied to the analog broadcast high frequency signal processing means, the digital broadcast high frequency signal processing means, and the analog demodulating means, wherein
the digital demodulating means generates information indicating a state of reception, and
when the power supply controlling means determines based on the information indicating the state of reception that the state of reception has degraded from a predetermined level during power supply to the digital broadcast high frequency signal processing means, the power supply controlling means supplies power to the analog broadcast high frequency signal processing means and the analog demodulating means in place of the digital broadcast high frequency signal processing means.

* * * * *